US008885432B2

(12) United States Patent
Narui

(10) Patent No.: US 8,885,432 B2
(45) Date of Patent: Nov. 11, 2014

(54) SEMICONDUCTOR DEVICE THAT PERFORMS REFRESH OPERATION

(71) Applicant: Seiji Narui, Tokyo (JP)

(72) Inventor: Seiji Narui, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 14/189,911

(22) Filed: Feb. 25, 2014

(65) Prior Publication Data

US 2014/0177372 A1 Jun. 26, 2014

Related U.S. Application Data

(63) Continuation of application No. 13/067,985, filed on Jul. 13, 2011, now Pat. No. 8,681,578.

(30) Foreign Application Priority Data

Jul. 15, 2010 (JP) ................. 2010-160554

(51) Int. Cl.
*G11C 7/00* (2006.01)
*G11C 11/406* (2006.01)
*G11C 11/404* (2006.01)

(52) U.S. Cl.
CPC ........ *G11C 11/404* (2013.01); *G11C 11/40611* (2013.01); *G11C 11/406* (2013.01)

USPC ....................................... 365/222; 365/185.25

(58) Field of Classification Search
USPC ............................................. 365/222, 185.25
See application file for complete search history.

(56) References Cited

U.S. PATENT DOCUMENTS

| 6,333,888 | B1 * | 12/2001 | Nakazawa | ............... 365/230.03 |
| 7,362,639 | B2 * | 4/2008 | Takahashi | .................... 365/222 |
| 7,760,572 | B2 | 7/2010 | Koshita | |
| 7,961,543 | B2 | 6/2011 | Koshita | |
| 2006/0114735 | A1 * | 6/2006 | Takahashi | .................... 365/222 |
| 2010/0177583 | A1 * | 7/2010 | Koshizuka | .................... 365/222 |

FOREIGN PATENT DOCUMENTS

| JP | 2006-99877 A | 4/2005 |
| JP | 2008-135113 A | 6/2008 |

\* cited by examiner

*Primary Examiner* — Harry W Byrne
(74) *Attorney, Agent, or Firm* — McGinn IP Law Group, PLLC

(57) ABSTRACT

A method for refreshing memory cells in a DRAM includes receiving a refresh command, receiving a refresh mode specifying signal in synchronization with the refresh command, refreshing a first quantity of memory cells when the refresh mode specifying signal has a first value, and refreshing a second quantity of memory cells, at least double the first quantity, when the refresh mode specifying signal has a second value.

12 Claims, 12 Drawing Sheets

|  | SEL | | | RM (BG0) |
| --- | --- | --- | --- | --- |
|  | Ax | Ay | Az |  |
| 1× mode | 0 | X | X | X |
|  | 1 | X | X | 0 |
| 2× mode | 1 | 0 | 1 | 1 |
| 4× mode | 1 | 1 | 0 | 1 |
| 8× mode | 1 | 1 | 1 | 1 |

FIG.4

FIG.5A  REF
        IREF
FIG.5B  REF
        IREF
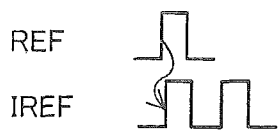
FIG.5C  REF
        IREF
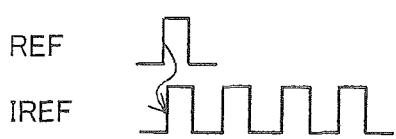
FIG.5D  REF
        IREF
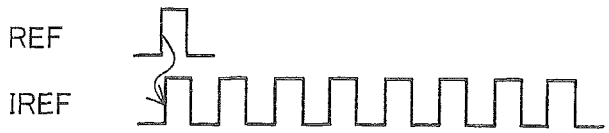

SEMICONDUCTOR DEVICE THAT PERFORMS REFRESH OPERATION

The present application is a Continuation Application of U.S. patent application Ser. No. 13/067,985 filed on Jul. 13, 2011, which is based on and claims priority from Japanese Patent Application No. 2010-160554, filed on Jul. 15, 2010, the entire contents of which is incorporated herein by reference.

BACKGROUND OF THE INVENTION

1. Field of the Invention

The present invention relates to a semiconductor device, and more particularly relates to a semiconductor device that performs a refresh operation in response to a refresh command issued from outside.

2. Description of Related Art

DRAMs (Dynamic Random Access Memories) that are typical semiconductor devices are volatile semiconductor memory devices. In the DRAMs, because a plurality of pieces of information are stored as electric charges in capacitors that are included in a plurality of memory cells, information is lost due to a leak current if a refresh operation is not performed periodically. Therefore, it is necessary to refresh all memory cells before the information is lost due to the leakage current. A period(=tREF) of 64 milliseconds (msec) is defined as a standard for refreshing all the memory cells. Accordingly, refresh commands issued by a controller are issued in such a manner that all word lines associated with all the memory cells are selected within a period of 64 msec, for example, the refresh commands are issued for $8192(=2^{13})$ times. Note that the exemplified number of 8192 times represents the number of word lines to which the plurality of memory cells are respectively connected.

As conventional techniques related to the refresh operation, techniques described in Japanese Patent Application Laid-open Nos. 2008-135113 and 2006-99877 are known. Japanese Patent Application Laid-open No. 2008-135113 discloses a semiconductor device in which refresh execution signals are generated for plural times in response to issuance of one refresh command, and a different memory bank is refreshed each time the refresh execution signals are activated. Japanese Patent Application Laid-open No. 2006-99877 discloses a semiconductor device that can specify a memory bank to be refreshed by supplying a bank address of the memory bank to a semiconductor memory device in synchronization with a refresh command.

However, the semiconductor devices disclosed in the above conventional techniques have an event such that, because the number of times of the refresh command to be issued within a period of 64 msec is fixed, there is less flexibility in terms of control performed by a controller.

The above event is not limited to DRAMs, and the event generally occurs to every semiconductor device that requires a refresh operation due to its memory cell configuration.

In one embodiment, there is provided a semiconductor device that includes a refresh control circuit that generates a refresh execution signal in response to a refresh command issued from outside; a refresh address counter that updates a refresh address in response to the refresh execution signal; and a first circuit that receives the refresh command and a first signal, the first signal supplied from outside in synchronization with the refresh command, and generates a refresh-mode specifying signal based on the refresh command and the first signal, and outputs a refresh-mode specifying signal to the refresh control circuit, wherein the refresh control circuit generates the refresh execution signal $2^n$ times each time when the refresh command is issued, where n is an integer equal to or larger than 0 and equal to or less than k, and the refresh control circuit changes a value of n based on the refresh-mode specifying signal.

In another embodiment, there is provided a semiconductor device that includes a refresh control circuit that generates a refresh execution signal in response to a refresh command issued from outside; and a memory cell array including a plurality of memory cells that are refreshed in response to the refresh execution signal, wherein the refresh control circuit generates the refresh execution signal $2^n$ times each time when the refresh command is issued, when number of times the refresh command is issued in a predetermined period is $2^{m+k-n}$, where m is a natural number and n is an integer equal to or larger than 0 and equal to or less than k.

According to the present invention, because the frequency of generation of a refresh execution signal in response to input of one refresh command can be changed dynamically, flexible control can be performed by a controller.

BRIEF DESCRIPTION OF THE DRAWINGS

The above features and advantages of the present invention will be more apparent from the following description of certain preferred embodiments taken in conjunction with the accompanying drawings, in which:

FIG. 4 is a table for explaining an operation of a refresh control circuit 143;

FIGS. 5A to 5D are diagrams for explaining a relation between a refresh command REF and a refresh execution signal IREF;

FIG. 11 is a timing chart for explaining an operation example of the semiconductor device 100a; and FIG. 12 is a timing chart for explaining another operation example of the semiconductor device 100a.

DETAILED DESCRIPTION OF THE EMBODIMENTS

A representative example of a technical concept is described below. It is needless to mention that the contents that the present application is to claim for patent are not limited to the following technical concept, but to the description of the appended claims. That is, the technical concept of the present invention is that refresh execution signals are generated $2^n$ times in response to one supply of a refresh command, assuming that the number of times the refresh command is supplied within a predetermined period, for example 64 msec, is $2^{m+k-n}$, where m is a natural number and n is an integer equal to or larger than 0 and equal to or less than k. In this case, m is a value related to the number of times is required for refreshing all word lines of all memory cells, n is a value related to a frequency of generation of the refresh execution signal in response to input of one refresh command, and k is a value related to a maximum frequency of generation of the refresh execution signal in response to input of one refresh command. A semiconductor device according to the present application has a plurality of operation modes, and the value of n is different for each operation mode. A refresh address counter in the semiconductor device is constituted with m+k bits. Therefore, the $2^{m+k-n}$ indicates that a controller issues the refresh command m times, where m is different for each operation mode, and the semiconductor device according to the present application refreshes all the memory cells by generating the refresh execution signal n times, where n is different for each operation mode. With this configuration, in an operation mode in which the frequency of issuance of the refresh command from the controller is high, the number of generation of the refresh execution signal by the semiconductor device in response to input of one refresh command decreases. On the other hand, in the operation mode in which the frequency of issuance of the refresh command is low, the number of generation of the refresh execution signal by the semiconductor device in response to input of one refresh command increases. Consequently, the frequency of generation of the refresh execution signal within a predetermined time, for example 64 msec, can be maintained constant regardless of the number of times the refresh command is issued.

Figure 1:
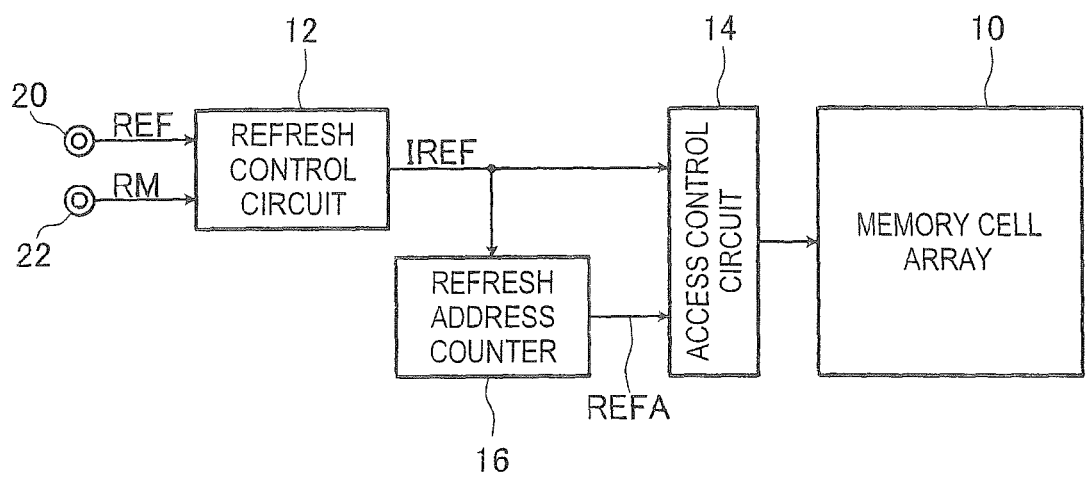
FIG. 1 is a block diagram for explaining a principle of the present invention.

FIG. 1 is a block diagram for explaining a principle of the present invention.

The present invention provides a semiconductor device (FIG. 1) including a memory cell array 10 that includes memory cells which require a refresh operation for retaining information, and the semiconductor device corresponds to a DRAM, for example. A plurality of word lines and a plurality of bit lines intersect each other in the memory cell array 10, and an access control circuit 14 performs the refresh operation. Upon activation of a refresh execution signal IREF, the access control circuit 14 refreshes all the memory cells connected to the word line specified by a refresh address REFA. The refresh operation is performed in response to an auto refresh command REF supplied from outside of the semiconductor device. The auto refresh command REF is a command issued to the semiconductor device from an external controller.

The auto refresh command REF is supplied to a refresh control circuit 12 from an external terminal 20. The refresh control circuit 12 is a circuit that generates the refresh execution signal IREF in response to the auto refresh command REF, and the refresh control circuit 12 generates the refresh execution signal IREF $2^n$ times in response to input of one auto refresh command REF, where n is an integer equal to or larger than 0 and equal to or less than k. The value of n is variable based on a refresh-mode specifying signal RM supplied from an external terminal 22 in synchronization with the auto refresh command REF. That is, the value of n is changed dynamically based on the refresh-mode specifying signal RM every time the auto refresh command REF is issued. In other words, a controller that controls the semiconductor device dynamically changes the refresh-mode specifying signal RM every time the controller issues the auto refresh command REF. As one example, in response to one supply of the auto refresh command REF, the semiconductor device generates the refresh execution signal IREF four times when the refresh-mode specifying signal RM is at a high level, and generates the refresh execution signal IREF eight times when the refresh-mode specifying signal RM is at a low level.

The refresh execution signal IREF is supplied to the access control circuit 14 and a refresh address counter 16. The refresh address counter 16 is a circuit that performs a counting operation every time the refresh execution signal IREF is activated, regardless of the value of n. The number of bits p constituting the refresh address counter 16 is m+k, assuming that the number of times the auto refresh command REF needs to be supplied for refreshing all the word lines when the value of n is k is $2^m$ (m is a natural number).

The principle of the present invention is as described above. With the above configuration, even when the value of n is changed dynamically due to the refresh-mode specifying signal RM, all the memory cells are refreshed as the count value of the refresh address counter 16 makes one counting cycle.

Preferred embodiments of the present invention are explained below in detail with reference to the accompanying drawings.

Figure 2:
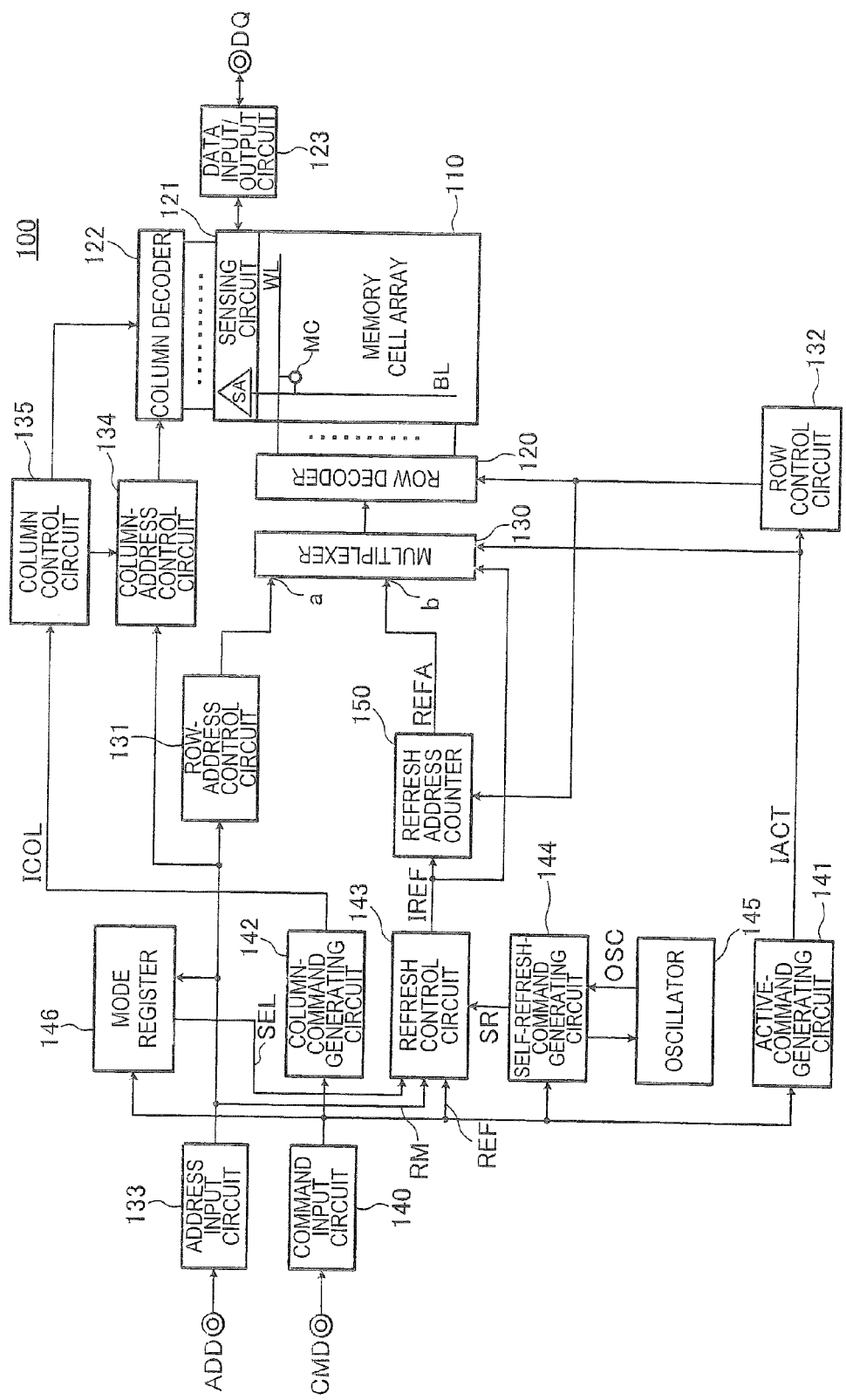
FIG. 2 is a block diagram showing a configuration of a semiconductor device 100 according to a first embodiment of the present invention.

FIG. 2 is a block diagram showing a configuration of a semiconductor device 100 according to a first embodiment of the present invention.

As shown in FIG. 2, the semiconductor device 100 according to the first embodiment includes a memory cell array 110 constituted by a plurality of memory cells MC. A plurality of word lines WL and a plurality of bit lines BL intersect each other in the memory cell array 110 and the memory cells MC are arranged at the intersections of the word lines WL and the bit lines BL. Note that FIG. 2 only shows one memory cell MC that is arranged at an intersection of one word line WL and one bit line BL.

The selection of the word lines WL is performed by a row decoder 120. Further, the bit lines BL are connected to corresponding sense amplifiers SA in a sensing circuit 121, and the sense amplifier SA selected by a column decoder 122 is connected to a data input/output circuit 123 that is connected to a data input/output terminal DQ. During a read operation, read data read from the memory cell array 110 is output to outside via the data input/output terminal DQ. During a write operation, write data input into the data input/output terminal DQ from outside is supplied to the memory cell array 110.

A row address is supplied to the row decoder 120 from a row-address control circuit 131 via a multiplexer 130. A row control circuit 132 controls operations of the row decoder 120. The row-address control circuit 131 is a circuit to which row addresses from among addresses (external addresses) supplied to an address input circuit 133 (first circuit) via an address terminal ADD are supplied. When a command input into a command input circuit 140 via a command terminal CMD is an active command (ACT command), an active-command generating circuit 141 activates an active command IACT and supplies it to the row control circuit 132. The active command IACT is also supplied to the multiplexer 130. When the active command IACT is activated, the multiplexer 130 selects an input node a. In this manner, when the active command and the row address are input from outside, the row decoder 120 activates the word line WL indicated by the row address input from outside. When the word line WL is activated, information of all the memory cells selected by the word line WL is read out, and amplified by the sense amplifier SA.

On the other hand, column addresses are supplied to the column decoder 122 from a column-address control circuit 134. A column control circuit 135 controls operations of the column decoder 122. The column-address control circuit 134 is a circuit to which column addresses among addresses (external addresses) input into the address input circuit 133 via the address terminal ADD are supplied. When a command input into the command input circuit 140 via the command terminal CMD is a column command (read command or write command), a column-command generating circuit 142 activates a read/write command ICOL and supplies the command to the column control circuit 135. With this configuration, when the column command and the column address are input from outside, the column decoder 122 selects the sense amplifier SA indicated by the column address input from outside. As a result, the read data amplified by the sense amplifier SA that is selected during the read operation is output to the data input/output circuit 123 and the write data supplied from the data input/output circuit 123 during the write operation overwrites information of the selected sense amplifier SA.

Apart from the active command and the column command, the auto refresh command REF, a self-refresh entry command SRE, a self-refresh exit command SRX, and a mode-register set command MRS are supplied to the command terminal CMD.

When the auto refresh command REF is issued, a refresh control circuit 143 activates the refresh execution signal IREF $2^n$ times, where n is an integer equal to or larger than 0 and equal to or less than k. When the refresh execution signal IREF is activated, the count value of a refresh address counter 150 is updated (incremented or decremented), and the refresh address REFA representing the count value is supplied to an input node b of the multiplexer 130. To be precise, information of the refresh address counter 150 before the counting begins is supplied to the multiplexer 130 in response to the refresh execution signal IREF, and thereafter the refresh address counter 150 performs counting in response to the refresh execution signal IREF. The refresh execution signal IREF is also supplied to the multiplexer 130, and the multiplexer 130 selects the input node b when the refresh execution signal IREF is activated. In this manner, when the refresh execution signal IREF is activated in response to the auto refresh command REF, the refresh address REFA output from the refresh address counter 150 is supplied to the row decoder 120, and the word line WL indicated by the refresh address REFA is activated. As described above, when the word line WL is activated, information of all the memory cells selected by the activated word line WL is read out, and amplified by the sense amplifier SA, and consequently all these memory cells are refreshed. The refresh execution signal IREF is also supplied to the row control circuit 132 (not shown), and the row control circuit 132 activates the row decoder 120.

The number of times the refresh control circuit 143 activates the refresh execution signal IREF in response to one supply of the auto refresh command REF is specified by the refresh-mode specifying signal RM and a setting value SEL of a mode register 146. The refresh-mode specifying signal RM is a part of an address signal, and although not particularly limited thereto, the refresh-mode specifying signal RM is a 1-bit signal in the first embodiment. Further, it is not necessarily that the refresh-mode specifying signal RM is a part of the address signal and another signal can be used as the refresh-mode specifying signal RM.

The mode register 146 is a circuit for setting various operation modes of the semiconductor device 100, and when the command input from outside is the mode-register set command MRS, these setting values can be overwritten by using information input via the address terminal ADD. The setting value SEL supplied to the refresh control circuit 143 is represented by predetermined bits in the mode register 146, and although not particularly limited thereto, the setting value SEL is a 3-bit signal in the first embodiment.

When the self-refresh entry command SRE is issued, a self-refresh-command generating circuit 144 is activated. When the self-refresh-command generating circuit 144 is activated, an operation of an oscillator 145 is started, and a self refresh signal SR (self-refresh request signal) is activated in synchronization with a signal OSC supplied from the oscillator 145 in a predetermined frequency that is asynchronous with an external frequency. The self refresh signal SR is supplied to the refresh control circuit 143, and the refresh operation is performed in a manner similar to that when the auto refresh command REF is issued. When the self-refresh exit command SRX is issued, the self-refresh-command generating circuit 144 is made inactive, and the operation of the oscillator 145 is stopped.

The entire configuration of the semiconductor device 100 is as described above.

Figure 3:
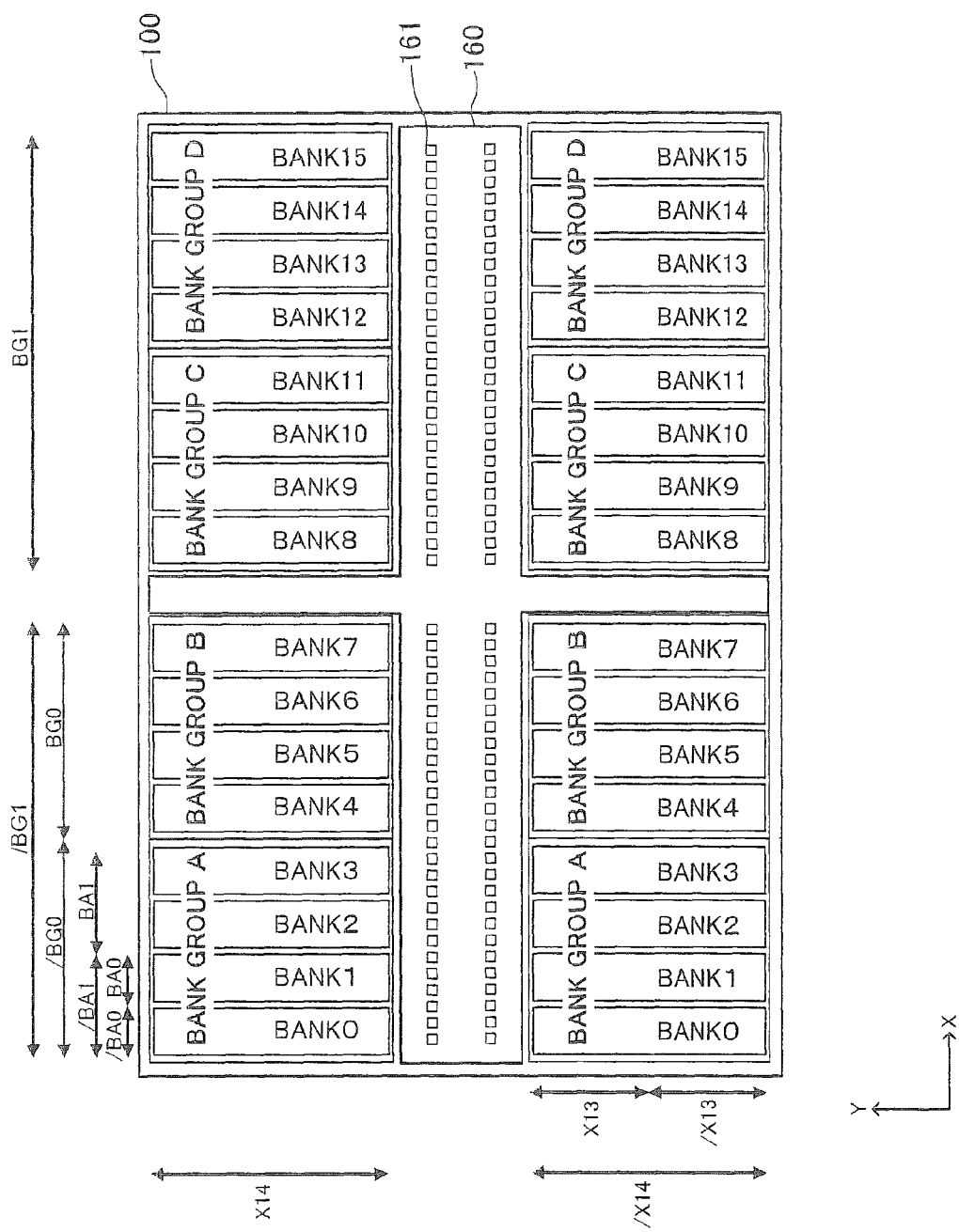
FIG. 3 is an explanatory diagram of a configuration of an address of a memory cell array 110.

FIG. 3 is an explanatory diagram of a configuration of an address of the memory cell array 110.

As shown in FIG. 3, in the first embodiment, the memory cell array 110 is divided into 16 banks, which are banks 0 to 15. These banks 0 to 15 are arranged along an X direction shown in FIG. 3, and are grouped into bank groups A to D. Among these banks, the banks 0 to 3 form the bank group A, the banks 4 to 7 form the bank group B, the banks 8 to 11 form the bank group C, and the banks 12 to 15 form the bank group D. Each of the bank groups is selected according to 2-bit bank group addresses BG1 and BG0, and a bank within the bank group is selected according to 2-bit bank addresses BA1 and BA0. A word line within the selected bank is selected according to 15-bit row addresses X14 to X0. Note that the banks are memory areas that can be mutually non-exclusively controlled.

In the first embodiment, each of the banks 0 to 15 is split into two along a Y direction while sandwiching a peripheral circuit area 160. The peripheral circuit area 160 is an area where all circuit blocks shown in FIG. 2 except the memory cell array 110 are arranged. External terminals 161, such as the data input/output terminal DQ, the address terminal ADD, and the command terminal CMD are also arranged in the peripheral circuit area 160. In the first embodiment, a most significant bit X14 of the row address determines which of the two memory areas split by the peripheral circuit area 160 is to be selected.

FIG. 4 is a table for explaining an operation of the refresh control circuit 143. In FIG. 4, "X" denotes "don't care".

As described above, the refresh control circuit 143 has a plurality of operation modes. The refresh control circuit 143 is activated by the auto refresh command REF, and the operation mode of the refresh control circuit 143 is specified by the refresh-mode specifying signal RM and the setting value SEL of the mode register 146.

As shown in FIG. 4, the setting value SEL of the mode register 146 includes 3-bit signals Ax, Ay, and Az. Among these signals, the signal Ax is a first mode register, and is a signal (information) that specifies whether to enable the refresh-mode specifying signal RM. The refresh-mode specifying signal RM is disabled when the logic level of the signal Ax is 0 and enabled when the logic level of the signal Ax is 1. The remaining two bits Ay and Az form a second mode register and are used as a signal (information) that specifies the operation mode of the refresh control circuit 143 when the refresh-mode specifying signal RM is enabled. The bank group address BG0 is used as the refresh-mode specifying signal RM in the first embodiment; however, the present invention is not limited thereto.

More specifically, when the logic level of the signal Ax is 0, the operation mode of the refresh control circuit 143 is "1× mode". The "1× mode" in the first embodiment represents a mode in which frequency of issuance of the auto refresh command REF that is issued from a memory controller conforms to the existing standards. This mode corresponds to a case where the auto refresh command REF is issued 8192 ($=2^{13}$) times in a period of 64 msec, for example. While the refresh control circuit 143 is operating in the 1× mode, when one auto refresh command REF is issued from outside, the refresh control circuit 143 activates the refresh execution signal IREF eight($=2^3$) times as shown in FIG. 5D. As mentioned above, when the number of times the refresh execution signal IREF is activated in response to one input of the auto refresh command REF is defined to be $2^n$, where n is an integer equal to or larger than 0 and equal to or less than k, n=k=3 is satisfied in the first embodiment.

When the logic level of the signal Ax is 1, the operation mode of the refresh control circuit 143 is set to any of "1× mode", "2× mode", "4× mode", and "8× mode". Every time the auto refresh command REF is issued, the controller can select, set, and change the operation mode of the semiconductor device 100 in a real time manner among these modes according to the refresh-mode specifying signal RM that is in synchronization with the auto refresh command REF. As shown in FIG. 4, the operation mode of the refresh control circuit 143 is set to the "1× mode" when the logic level of the signal Ax is 1 and the logic level of the refresh-mode specifying signal RM is 0. Meanwhile, the operation mode of the refresh control circuit 143 is set to any of the "2× mode", "4× mode", and "8× mode" when the logic level of the signal Ax is 1 and the logic level of the refresh-mode specifying signal RM is also 1. Because the bank group address BG0, which is a part of the addresses, is used as the refresh-mode specifying signal RM, the dynamic selection of the operation mode among the "1× mode" or "2× mode" or higher mode every time the auto refresh command REF is issued is made possible.

When the logic level of the signal Ax is 1 and the logic level of the refresh-mode specifying signal RM is 1, the operation mode is selected according to a combination of the signals Ay and Az included in the mode register 146. In the first embodiment, the "2× mode" is selected when the logic levels of the signals Ay and Az are 0 and 1, respectively, the "4× mode" is selected when they are 1 and 0, respectively, and the "8× mode" is selected when they are 1 and 1, respectively. Because issuance of the mode-register set command MRS, which is different from the auto refresh command REF, is required for changing the logic levels of the signals in the mode register 146 as described above, the operation mode of the refresh control circuit 143 cannot be selected dynamically among the "2× mode", "4× mode", and "8× mode". However, the present invention is not limited thereto, and the selection of the operation mode among the "2× mode", "4× mode", and "8× mode" can be enabled dynamically using other bits of the address signal.

In the "2× mode", "4× mode", and "8× mode", frequency of issuance of the auto refresh command REF that is issued from the memory controller is twice, four times, and eight times, respectively, the existing standards. For example, in a period of 64 msec, the auto refresh command REF is issued 16384($=2^{14}$) times in the "2× mode", 32768($=2^{15}$) times in the "4× mode", and 65536($=2^{16}$) times in the "8× mode".

When the refresh control circuit 143 is operating in the 2× mode, in response to one issuance of the auto refresh command REF from outside, the refresh control circuit 143 activates the refresh execution signal IREF four($=2^2$) times as shown in FIG. 5C. In this case, n=k−1=2. In other words, k=n+1=3. Further, when the refresh control circuit 143 is operating in the 4× mode, in response to one issuance of the auto refresh command REF from outside, the refresh control circuit 143 activates the refresh execution signal IREF twice ($=2^1$) as shown in FIG. 5B. In this case, n=k−2=1. In other words, k=n+2=3. Further, when the refresh control circuit 143 is operating in the 8× mode, in response to one issuance of the auto refresh command REF from outside, the refresh control circuit 143 activates the refresh execution signal IREF once($=2^0$) as shown in FIG. 5A. In this case, n=k−3=0. In other words, k=n+3=3.

In the present invention, the operation modes of the refresh control circuit 143 does not need to be limited to the four types mentioned above, and can be five or more types or three or less types. For example, when the operation modes of the refresh control circuit 143 are of three types, that is, the "1× mode", "2× mode", and "4× mode", in response to one supply of the auto refresh command REF, it suffices that when the "1× mode" is selected, the refresh execution signal IREF is activated four times as shown in FIG. 5C, when the "2× mode" is selected, the refresh execution signal IREF is activated twice as shown in FIG. 5B, and when the "4× mode" is selected, the refresh execution signal IREF is activated once as shown in FIG. 5A. Similarly, when the operation modes are of two types, that is, the "1× mode" and "2× mode", in response to one supply of the auto refresh command REF, it suffices that when the "1× mode" is selected, the refresh execution signal IREF is activated twice as shown in FIG. 5B, and when the "2× mode" is selected, the refresh execution signal IREF is activated once as shown in FIG. 5A.

The refresh execution signal IREF generated in this manner is supplied to the refresh address counter 150, and the refresh address counter 150 performs a counting operation every time the refresh execution signal IREF is activated. The number of bits constituting the refresh address counter 150 is m+k, assuming that the number of times the auto refresh command REF needs to be supplied for refreshing all the word lines when the value of n is k is $2^m$ (m is a natural number). Accordingly, when m=13 and k=3, as in the above example, the number of bits constituting the refresh address counter 150 becomes 16. Therefore, the count value makes one counting cycle as the refresh execution signal IREF is activated (supplied) $2^{16}$ times.

In the technical concept of the present application, the bit of the row address to which the refresh address REFA, which is an output of the refresh address counter 150, is allocated is not particularly limited. Accordingly, the refresh address REFA can include the bank address or the bank group address, or the refresh address REFA does not need to include these addresses. For example, when m=13 and k=3, the 16-bit refresh address REFA can be used as the bank addresses BA1 and BA0 and the row addresses X13 to X0. In this case, the most significant bits of the bank group addresses BG1 and BG0 and the row addresses are not used as the refresh address REFA. Therefore, in one refresh operation (the refresh execution signal IREF activated once), one bank each is selected from each bank group address, and from the memory areas constituting the selected banks, those word lines that have 0 and 1 as the row address X14 are selected.

As another example, when m=13 and k=2, that is, when the operation modes of the refresh control circuit 143 are of three types, that is, the "1× mode", "2× mode", and "4× mode", the 15-bit refresh address REFA can be used as the row addresses X14 to X0. In this case, because the bank group addresses and the bank addresses are not used as the refresh address REFA, in one refresh operation (the refresh execution signal IREF activated once), one word line from each bank is selected.

The entire configuration of the semiconductor device 100 according to the first embodiment is as described above. An operation of the semiconductor device 100 is explained next. To facilitate understanding, in the following explanations, the refresh control circuit 143 that has two types of operation modes, that is, the "1× mode" and "2× mode" is used. The selection between the "1× mode" and "2× mode" is performed dynamically by the refresh-mode specifying signal RM.

Figure 6:
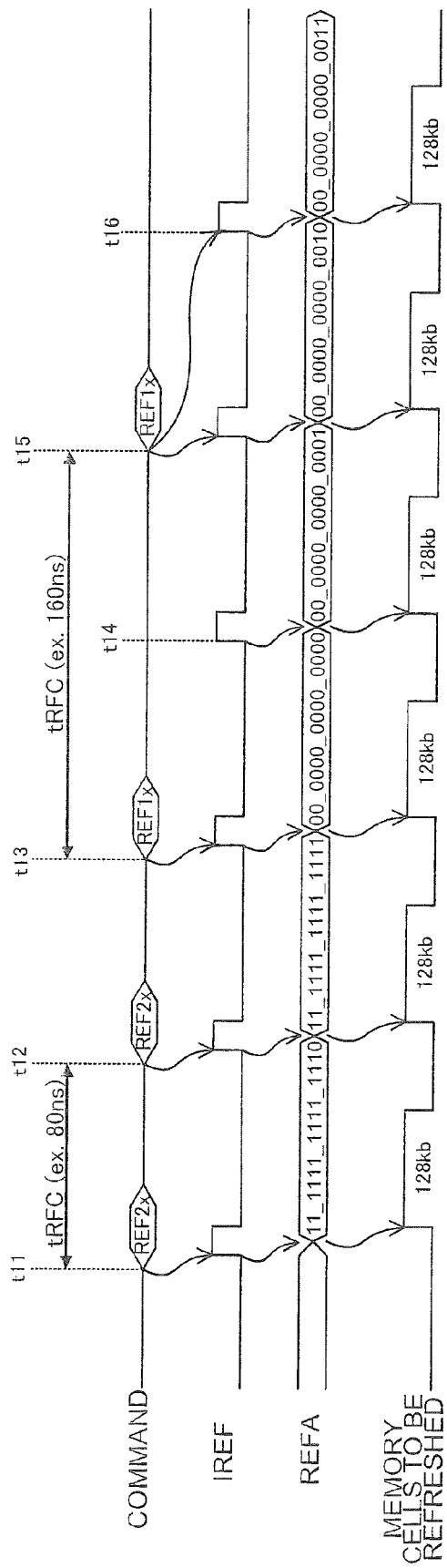
FIG. 6 is a timing chart for explaining an operation of the semiconductor device 100.

FIG. 6 is a timing chart for explaining an operation of the semiconductor device 100.

In the example shown in FIG. 6, the auto refresh command REF is issued at times t11, t12, t13, and t15. Among these times, when the auto refresh command REF is issued at the times t11 and t12, the "2× mode" (denoted by reference character "REF2×" in FIG. 6) is selected by the refresh-mode specifying signal RM, and when the auto refresh command REF is issued at the times t13 and t15, the "1× mode" (denoted by reference character "REF1×" in FIG. 6) is selected by the refresh-mode specifying signal RM. Accordingly, in response to each auto refresh command REF issued at the times t11 and t12, the refresh execution signal IREF is activated once, and in response to each auto refresh command REF issued at the times t13 and t15, the refresh execution signal IREF is activated twice.

As a result, the refresh execution signal IREF is activated at the time t11 to a time t16, and every time the refresh execution signal IREF is activated, the counting operation of the refresh address counter 150 is performed and a refresh operation is performed on the memory cell array 110. In this example, 128 kilobytes (kb) of memory cells are refreshed in one refresh operation. Furthermore, in this example, because the operation modes of the refresh control circuit 143 are of two types, that is, the "1× mode" and "2× mode", k is equal to 1. The number of bits constituting the refresh address counter 150 is 14(=13+1), assuming that the number of times the auto refresh command REF needs to be supplied for refreshing all the word lines when the value of n is k(=1) is 8192($2^{13}$).

In this manner, because the frequency of generation of the refresh execution signal IREF is changed according to the operation mode, a minimum issue interval tRFC for the auto refresh command REF also changes according to the operation mode. Specifically, the minimum issue interval tRFC for performing the refresh operation in the "2× mode" is half of the minimum issue interval tRFC for performing the refresh operation in the "1× mode". For example, when the minimum issue interval tRFC for performing the refresh operation in the "1× mode" is 160 nanoseconds (nsec), the minimum issue interval tRFC for performing the refresh operation in the "2× mode" becomes 80 nsec.

Figure 7:
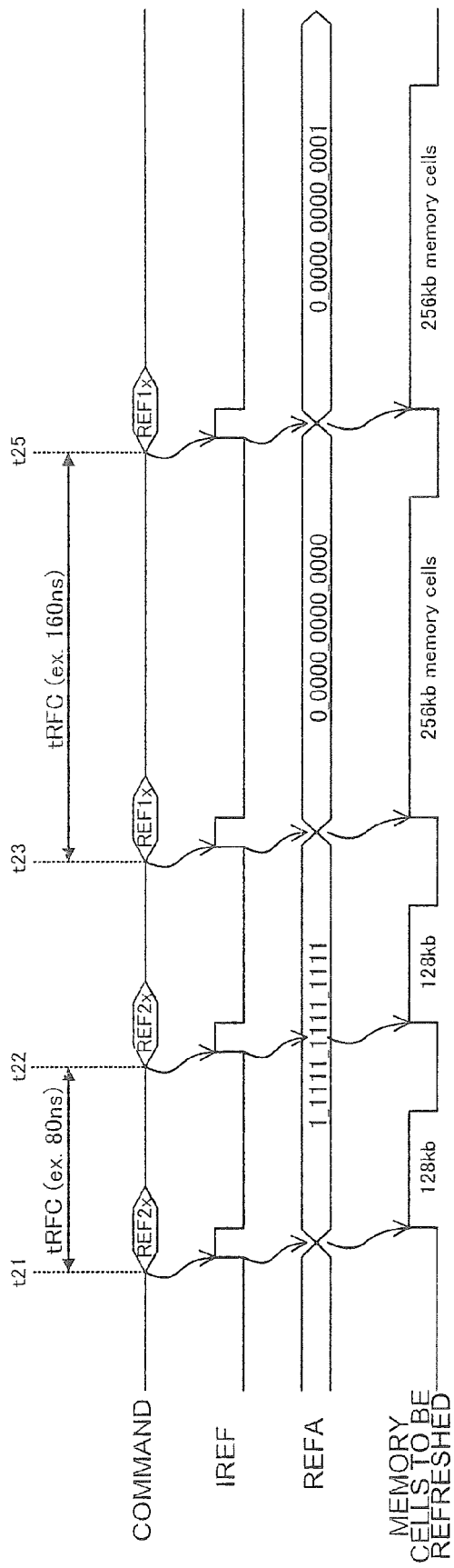
FIG. 7 is a timing chart for explaining an operation example of a semiconductor device according to a comparative example.
Figure 8:
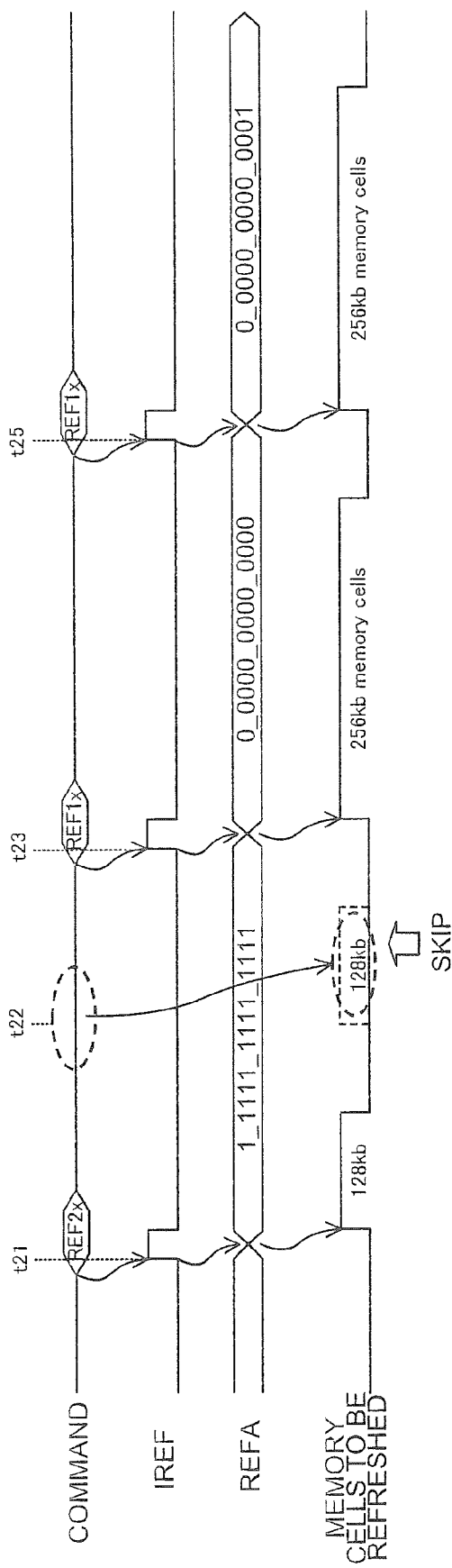
FIG. 8 is a timing chart for explaining another operation example of the semiconductor device according to the comparative example.

FIGS. 7 and 8 are timing charts for explaining operations of a semiconductor device according to a comparative example.

In the comparative example shown in FIGS. 7 and 8, the refresh execution signal IREF is activated only once in response to the auto refresh command REF, regardless of the operation mode, and 256 kb of memory cells are refreshed in the "1× mode", and 128 kb of memory cells are refreshed in the "2× mode". The number of bits of the refresh address counter 150 is 13(=m). In the "1× mode" the counting operation is performed every time the auto refresh command REF is issued, and in the "2× mode" the counting operation is performed when the auto refresh command REF is odd-numbered, while no counting operation is performed when the auto refresh command REF is even-numbered. That is, when the "2× mode" is selected, the counting operation is performed once for generation of every two auto refresh commands REF.

Even in this example, as shown in FIG. 7, if the operation mode is switched to the "1× mode" after the even-numbered auto refresh command REF is issued in the "2× mode", the counting operation by the refresh address counter 150 is continued properly, and all the memory cells are refreshed.

However, as shown in FIG. 8, if the operation mode is switched to the "1× mode" after the odd-numbered auto refresh command REF is issued in the "2× mode", the refresh operation is not performed in some of the memory cells (denoted by 'SKIP' in FIG. 8). Specifically, when no auto refresh command REF is issued at a time t22 and the operation mode is switched to the "1× mode" at a time t23, only half of the 256 kb of memory cells corresponding to a predetermined value (denoted by all 1 in the example shown in FIG. 8) of the refresh address REFA are refreshed, and no refresh operation is performed on the remaining half of the memory cells, resulting in a change in the refresh address REFA (denoted by all 0 in the example shown in FIG. 8).

Figure 9:
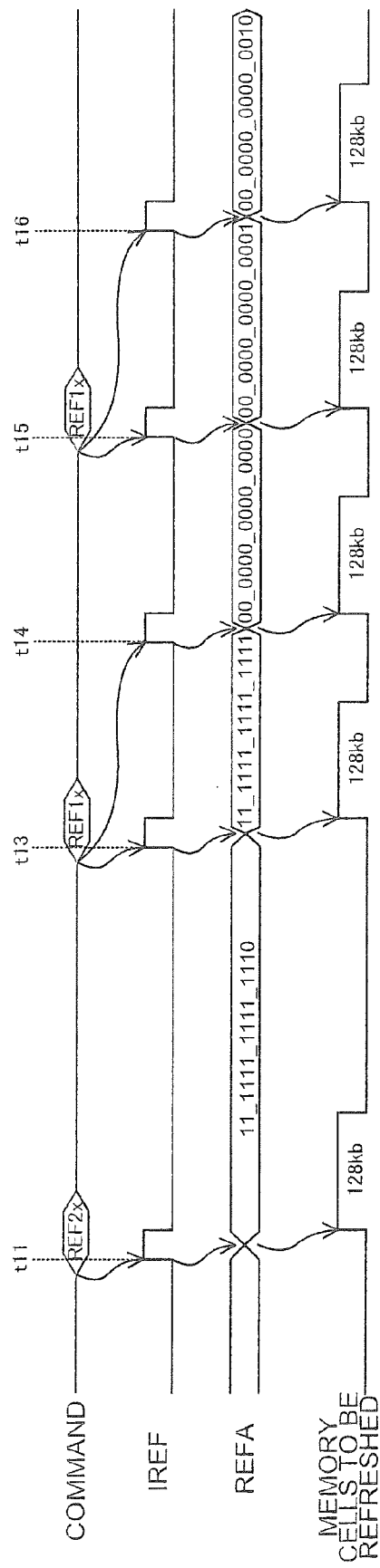
FIG. 9 is a timing chart for explaining another operation example of the semiconductor device 100.

The above problem does not arise in the semiconductor device 100 according to the first embodiment. That is, in the first embodiment, the number of bits of the refresh address counter 150 is increased to m+k, and the refresh execution signal IREF is activated once or plural times according to the operation mode in response to one supply of the auto refresh command REF. Because the refresh address counter 150 performs the counting operation in response to the refresh execution signal IREF regardless of the operation mode, even when the auto refresh command REF is output from the controller in the same pattern as shown in FIG. 8, the change in the refresh address REFA is performed properly as shown in FIG. 9.

As described above, according to the first embodiment, dynamic switching of the operation modes during the refresh operation leads to performing of flexible control by the controller. Furthermore, even when the controller switches the operation modes in a real time manner, because a state where some of the memory cells in the semiconductor device are not refreshed never occurs, the controller can switch between the operation modes at an arbitrary timing.

A second embodiment of the present invention is explained next.

Figure 10:
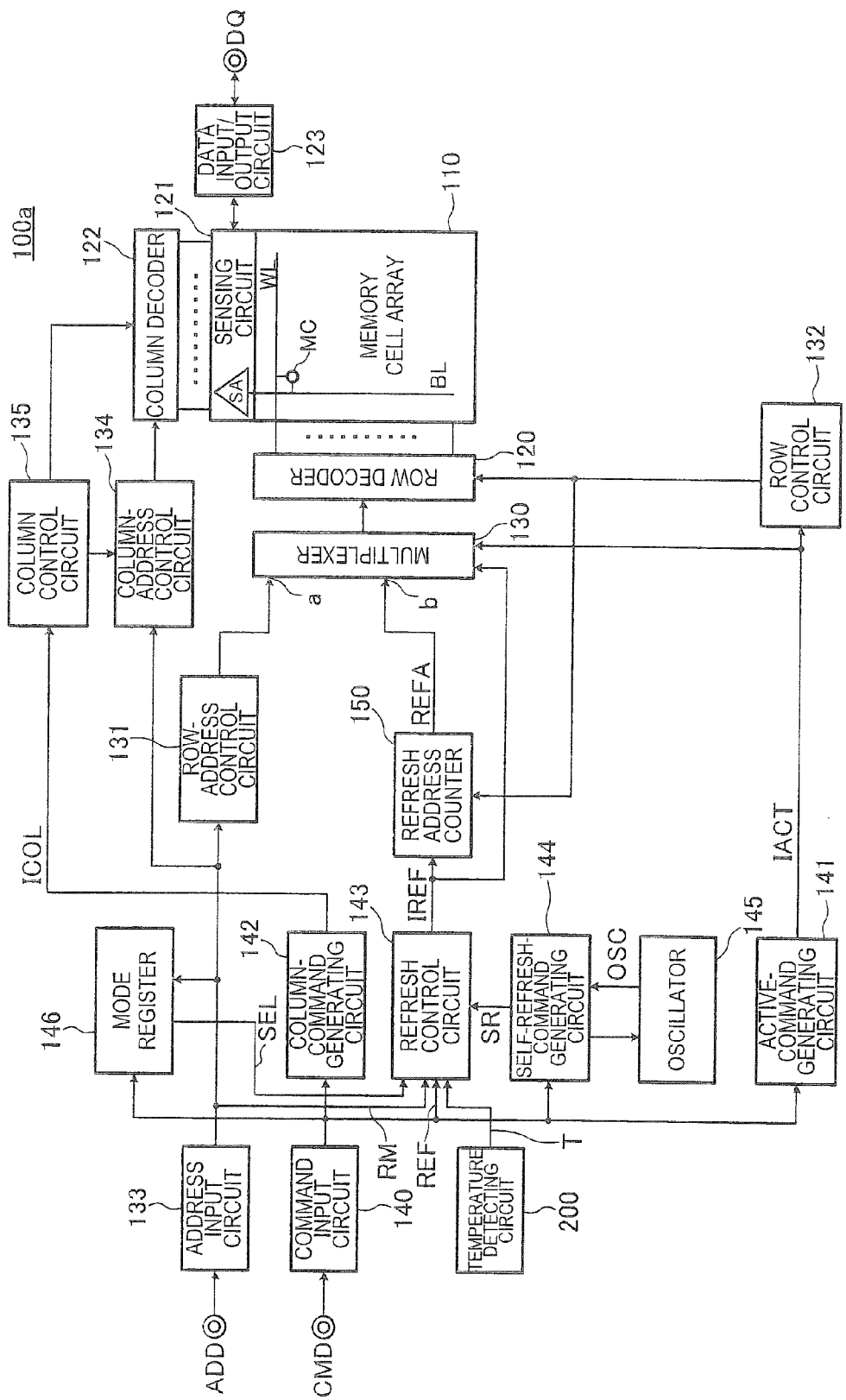
FIG. 10 is a block diagram showing a configuration of a semiconductor device 100a according to a second embodiment of the present invention.

FIG. 10 is a block diagram showing a configuration of a semiconductor device 100a according to the second embodiment.

As shown in FIG. 10, the semiconductor device 100a according to the second embodiment differs from the semiconductor device 100 shown in FIG. 2 in that it includes a temperature detecting circuit 200, and a temperature detection signal T as an output of the temperature detecting circuit 200 is supplied to the refresh control circuit 143. Since other configurations of the semiconductor device 100a are identical to those of the semiconductor device 100 shown in FIG. 2, like constituent elements are denoted by like reference characters and redundant explanations thereof will be omitted.

The temperature detecting circuit 200 is a circuit that measures a chip temperature (for example, a temperature of a substrate on which the memory cell array 110 is formed), compares the measured chip temperature with a predetermined temperature (for example, 45° C.), and activates the temperature detection signal T when the measured temperature is lower than the predetermined temperature. The refresh control circuit 143 performs the same operation as those in the first embodiment when the temperature detection signal T is not activated. However, when the temperature detection signal T is activated, the refresh control circuit 143 reduces the frequency of generation of the refresh execution signal IREF. In other words, when the temperature detection signal T is activated, the refresh control circuit 143 reduces the frequency of generation of the refresh execution signal IREF to less than the value n related to the number of the refresh execution signals IREF generated in response to one supply of the auto refresh command REF. One method for reducing the frequency of generation of the refresh execution signal IREF is thinning-out of the refresh execution signals IREF that are to be activated.

Figure 11:
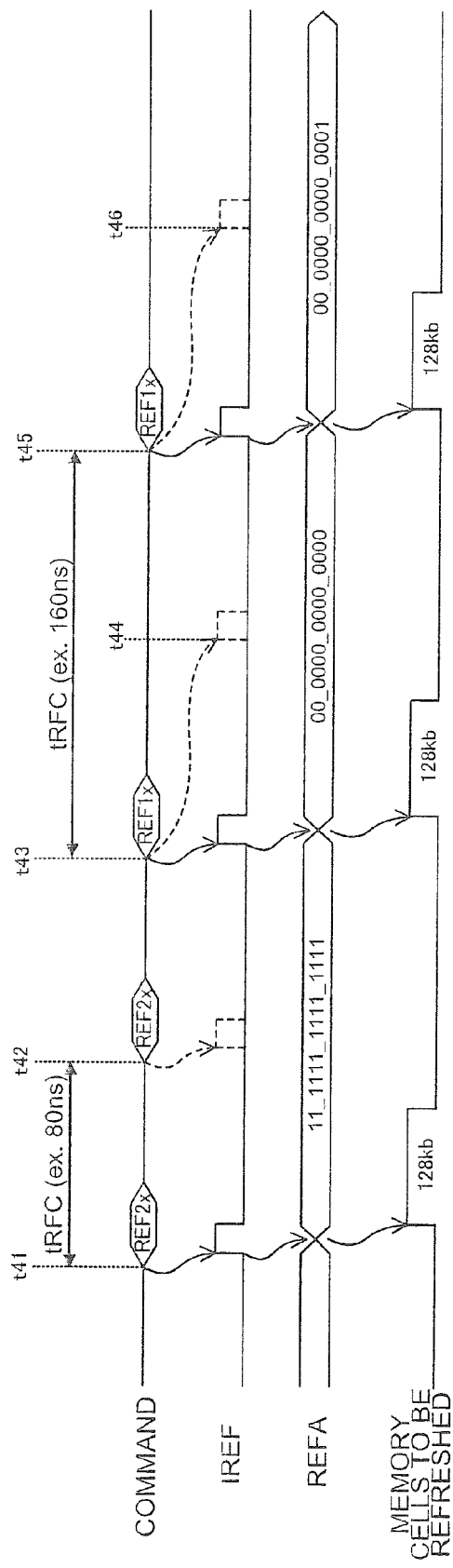

FIG. 11 is a timing chart for explaining an operation of the semiconductor device 100a.

In an example shown in FIG. 11, when the temperature detection signal T is activated, the refresh execution signals IREF are thinned out once every two times. That is, once every two times the refresh execution signal IREF that is supposed to be activated is not activated. Specifically, the refresh execution signal IREF is generated in response to the auto refresh command REF issued in the "2× mode" at a time t41, but no refresh execution signal IREF is generated in response to the auto refresh command REF issued in the "2× mode" at a time t42 (denoted by a broken line in FIG. 11 and the same applies below). Further, the refresh execution signal IREF is generated for the first time in response to the auto refresh command REF issued in the "1× mode" at a time t43; however, no refresh execution signal IREF that is supposed to be generated based on the concept of the value n (n=1) related to the number of the refresh execution signals IREF generated in the "1× mode" at a time t44 in response to one supply of the auto refresh command REF (at the time t43) is generated. Similarly, the refresh execution signal IREF is generated for the first time in response to the auto refresh command REF issued in the "1× mode" at a time t45; however, no refresh execution signal IREF that is supposed to be generated at a time t46 is generated.

Figure 12:
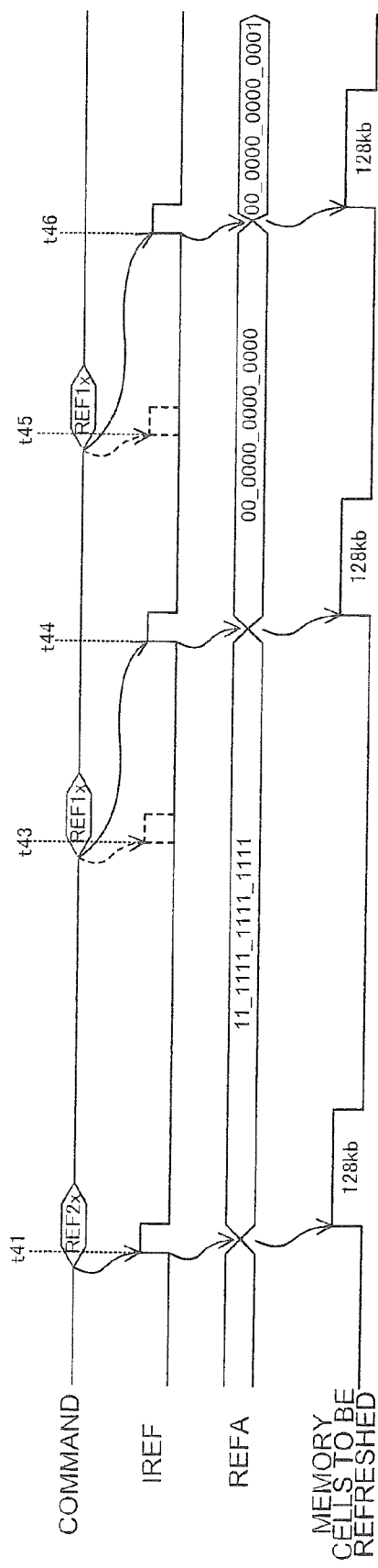

With this configuration, the number of times the refresh operation performed on the memory cell array 110 is reduced. Therefore, the power consumption in a low chip temperature state is reduced. In this case, a period where the refresh operation is performed for all the memory cells becomes longer than a predetermined period (for example, 64 msec). However, because a typical value of an information retaining time of the memory cells also increases in the low chip temperature state, no information is lost. Furthermore, as shown in FIG. 12, even when the auto refresh command REF is output from the controller in the same pattern as shown in FIG. 8, the change in the refresh address REFA is performed properly.

In the second embodiment, the temperature detecting circuit 200 is provided within the semiconductor device 100a; however, it is not essential that the temperature detecting circuit 200 is provided within the semiconductor device 100a, and a configuration that receives the temperature detection signal T from outside can be provided instead. In this case, the temperature indicated by the temperature detection signal T is the temperature relevant to a system having the semiconductor device 100a and a controller incorporated therein, or a module having a plurality of the semiconductor devices 100a incorporated therein.

It is apparent that the present invention is not limited to the above embodiments, but may be modified and changed without departing from the scope and spirit of the invention.

The technical concept of the present application is not limited to a refresh function related to an information retaining operation of DRAM cells, and can be also applied to refresh functions related to all volatile cell configurations in general. In addition, the circuit format in each of circuit blocks disclosed in the drawings and in other circuits that generate control signals are not limited to the circuit format disclosed in the above embodiments.

The technical concept of the present invention can be applied to various types of semiconductor devices. For example, the present invention can be applied to a general semiconductor device such as a CPU (Central Processing Unit), an MCU (Micro Control Unit), a DSP (Digital Signal Processor), an ASIC (Application Specific Integrated Circuit), an ASSP (Application Specific Standard Product), and Memory. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When an FET (Field Effect Transistor) is used as the transistor in the present invention, various types of FETs such as MIS (Metal-Insulator Semiconductor) and TFT (Thin Film Transistor) can be used as well as MOS (Metal Oxide Semiconductor). Further, transistors other than FETs such as bipolar transistors can be used as some of transistors.

In addition, a PMOS transistor (P-channel MOS transistor) is a representative example of a second conductive transistor, and an NMOS transistor (N-channel MOS transistor) is a representative example of a first conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:

1. A method for refreshing memory cells in a DRAM comprising:
   receiving a refresh command;
   receiving a refresh mode specifying signal in synchronization with the refresh command;
   refreshing a first quantity of memory cells when the refresh mode specifying signal has a first value; and
   refreshing a second quantity of memory cells, at least double the first quantity, when the refresh mode specifying signal has a second value.

2. The method as claimed in claim 1 wherein the refresh mode specifying signal is a binary signal.

3. The method as claimed in claim 2 wherein the refresh mode specifying signal is an address signal.

4. The method as claimed in claim 1 wherein the second quantity of memory cells are refreshed simultaneously when the refresh mode specifying signal has the second value.

5. The method as claimed in claim 1 wherein the first quantity of memory cells are refreshed simultaneously when the refresh mode specifying signal has the first value.

6. The method as claimed in claim 5 wherein the second quantity of memory cells are refreshed sequentially, at each time refreshing the first quantity of memory cells, when the refresh mode specifying signal has the second value.

7. The method as claimed in claim 1 wherein the first quantity of memory cells are refreshed in a first number of sequential operations when the refresh mode specifying signal has the first value and the second quantity of memory cells are refreshed in a second number of sequential operations greater than the first number of sequential operations when the refresh mode specifying signal has the second value.

8. The method as claimed in claim 1 wherein the second quantity is a fixed value.

9. The method as claimed in claim 1 wherein the first quantity is programmable in a mode register.

10. The method as claimed in claim 9 wherein the first quantity is programmable as three different values.

11. The method as claimed in claim 10 wherein the three different values are encoded as two bits.

12. The method as claimed in claim 10 wherein the first quantity is programmable as either ½, ¼, or ⅛ the second quantity.

* * * * *